US011658376B2

(12) United States Patent
Iida et al.

(10) Patent No.: US 11,658,376 B2
(45) Date of Patent: *May 23, 2023

(54) SIGNAL TRANSMISSION LINE INCLUDING A FLEXIBLE RESIN LAMINATE HAVING INTERIOR HOLLOW PORTIONS OVERLAPPING THE SIGNAL TRANSMISSION LINE WITH THE HOLLOW PORTIONS HAVING A VENT HOLE

(71) Applicant: Murata Manufacturing Co., Ltd., Nagaokakyo (JP)

(72) Inventors: Kanto Iida, Nagaokakyo (JP); Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/568,865

(22) Filed: Jan. 5, 2022

(65) Prior Publication Data

US 2022/0131250 A1 Apr. 28, 2022

Related U.S. Application Data

(63) Continuation of application No. 16/843,979, filed on Apr. 9, 2020, now Pat. No. 11,251,511, which is a
(Continued)

(51) Int. Cl.
*H01P 3/08* (2006.01)
*H01P 3/00* (2006.01)

(52) U.S. Cl.
CPC .............. *H01P 3/082* (2013.01); *H01P 3/003* (2013.01); *H01P 3/08* (2013.01); *H01P 3/081* (2013.01);
(Continued)

(58) Field of Classification Search
CPC .......... H01P 3/081; H01P 3/082; H01P 3/085; H01P 3/087; H01P 3/088
(Continued)

(56) References Cited

U.S. PATENT DOCUMENTS 3,135,935 A * 6/1964 Engelbrecht .......... H01P 11/003
174/268
10,673,114 B2 * 6/2020 Iida et al. ............... H01P 3/082
(Continued)

OTHER PUBLICATIONS

Ida et al., "A Signal Transmission Line Including a Flexible Resin Laminate Having Interior Hollow Portions Overlapping the Signal Transmission Line", U.S. Appl. No. 16/843,979, filed Apr. 9, 2020.

*Primary Examiner* — Benny T Lee
(74) *Attorney, Agent, or Firm* — Keating & Bennett, LLP

(57) ABSTRACT

A signal transmission line includes a laminate, a signal conductor, a hollow portion, and a reinforcing conductor. The laminate includes a flexible laminate including resin layers each of which has flexibility. The signal conductor extends in a signal transmission direction of the laminate and is disposed in an intermediate position in a laminating direction of the resin layers. The hollow portion is in the laminate and defined by an opening provided at a portion of the plurality of resin layers. The reinforcing conductor is in the laminate. The hollow portion is disposed at a position overlapping with the signal conductor, in a plan view of the laminate from a surface perpendicular or substantially perpendicular to the laminating direction. The reinforcing conductor is disposed at a position different from the position of the hollow portion in a plan view.

9 Claims, 17 Drawing Sheets

Related U.S. Application Data continuation of application No. 16/022,761, filed on Jun. 29, 2018, now Pat. No. 10,673,114, which is a continuation of application No. PCT/JP2017/000960, filed on Jan. 13, 2017.

(52) U.S. Cl.
CPC .............. *H01P 3/085* (2013.01); *H01P 3/087* (2013.01); *H01P 3/088* (2013.01)

(58) Field of Classification Search
USPC ........................................................ 333/238
See application file for complete search history.

(56) References Cited

U.S. PATENT DOCUMENTS

| | | | |
|---|---|---|---|
| 11,251,511 B2* | 2/2022 | Iida et al. ............... | H01P 3/087 |
| 2014/0028413 A1* | 1/2014 | Ishii et al. ............. | G01R 1/067 |
| | | | 333/33 |

* cited by examiner

SIGNAL TRANSMISSION LINE INCLUDING A FLEXIBLE RESIN LAMINATE HAVING INTERIOR HOLLOW PORTIONS OVERLAPPING THE SIGNAL TRANSMISSION LINE WITH THE HOLLOW PORTIONS HAVING A VENT HOLE

CROSS REFERENCE TO RELATED APPLICATIONS

This application claims the benefit of priority to Japanese Patent Application No. 2016-012945 filed on Jan. 27, 2016 and is a Continuation Application of U.S. application Ser. No. 16/843,979 filed on Apr. 9, 2020, now U.S. Pat. No. 11,251,511 issued on Feb. 15, 2022, which is a Continuation Application of U.S. application Ser. No. 16/022,761 filed on Jun. 29, 2018, now U.S. Pat. No. 10,673,114 issued on Jun. 2, 2020, which is a Continuation Application of PCT Application No. PCT/JP2017/000960 filed on Jan. 13, 2017. The entire contents of each application are hereby incorporated herein by reference.

BACKGROUND OF THE INVENTION

1. Field of the Invention

The present invention relates to a signal transmission line that transmits a high-frequency signal.

2. Description of the Related Art

At present, a large number of signal transmission lines to be used for transmission of a high frequency signal are obtained by forming a signal conductor on a dielectric substrate. In such a signal transmission line, it is preferred that a transmission loss should be low. Therefore, for example, a printed circuit board for high-speed transmission disclosed in Japanese Unexamined Patent Application Publication No. 2003-133661 includes an air layer in a dielectric substrate, and a signal conductor arranged so as to be in contact with the air layer.

However, the printed circuit board for high-speed transmission disclosed in Japanese Unexamined Patent Application Publication No. 2003-133661 is not easily subjected to shape deformation, such as bending or twisting.

SUMMARY OF THE INVENTION

Preferred embodiments of the present invention provide signal transmission lines having reduced transmission loss and being easily deformed.

A signal transmission line according to a preferred embodiment of the present invention includes a laminate, a signal conductor, a hollow portion, and a reinforcing conductor. The laminate includes a plurality of resin layers each of which has flexibility and are laminated on one another, and the laminate has flexibility. The signal conductor extends in a signal transmission direction of the laminate and is disposed in an intermediate position in a laminating direction in which the plurality of resin layers in the laminate are laminated on each other. The hollow portion is provided in the laminate and defined by an opening provided at a portion of the plurality of resin layers. The reinforcing conductor is provided in the laminate.

The hollow portion is disposed at a position that overlaps with the signal conductor, in a plan view of the laminate from a surface perpendicular or substantially perpendicular to the laminating direction. The reinforcing conductor is disposed at a position different from the position of the hollow portion in a plan view.

With this configuration, the transmission loss of a high frequency signal that the signal conductor transmits is able to be significantly reduced or prevented by the hollow portion provided in the laminate. In addition, since the laminate has flexibility, the signal transmission line is able to be easily deformed. Further, due to the hollow portion provided in the laminate, the signal transmission line is able to be more easily deformed. On the other hand, the strength of a holding portion that does not include the hollow portion is increased by the reinforcing conductor, so that crushing of the hollow portion due to deformation of the laminate is able to be significantly reduced or prevented.

In addition, a signal transmission line according to a preferred embodiment of the present invention includes a ground conductor that faces the signal conductor across the hollow portion in the laminating direction.

With this configuration, a microstrip line or a stripline is able to be obtained as a signal transmission line. Then, the hollow portion is provided between the signal conductor and the ground conductor, so that a transmission loss is significantly reduced or prevented.

In addition, in a signal transmission line according to a preferred embodiment of the present invention, the reinforcing conductor preferably includes a plurality of reinforcing conductors, and the plurality of reinforcing conductors are preferably disposed in the laminating direction.

With this configuration, the strength of the holding portion that does not include the hollow portion is further increased, so that crushing of the hollow portion is able to be further significantly reduced or prevented.

In addition, in a signal transmission line according to a preferred embodiment of the present invention, the reinforcing conductor preferably includes a plurality of reinforcing conductors, and the plurality of reinforcing conductors are preferably disposed at intervals in the signal transmission direction.

With this configuration, the difference in strength of the holding portion is able to be provided in the signal transmission direction. As a result, the laminate is more easily deformed while crushing of the hollow portion is significantly reduced or prevented.

In addition, in a signal transmission line according to a preferred embodiment of the present invention, the plurality of reinforcing conductors arranged in the laminating direction are preferably connected to each other through an interlayer connection conductor in the laminating direction.

With this configuration, the strength of the holding portion that does not include the hollow portion is further increased, so that crushing of the hollow portion is able to be further significantly reduced or prevented.

In addition, in a signal transmission line according to a preferred embodiment of the present invention, the hollow portion preferably includes an insulating member disposed at the position that overlaps with the signal conductor in a plan view, the insulating member having a height in the laminating direction.

With this configuration, crushing of the hollow portion is able to be further significantly reduced or prevented.

In addition, in a signal transmission line according to a preferred embodiment of the present invention, the thickness of a portion that does not overlap with the hollow portion in a resin layer on which the signal conductor is provided is preferably smaller than the thickness of a portion that overlaps with the hollow portion.

With this configuration, when the plurality of resin layers are laminated to obtain the laminate, stress that acts on the resin layer on which the signal conductor is provided is able to be significantly reduced or prevented. As a result, the signal conductor is arranged in a desired shape at a desired position in the laminate.

In addition, in a signal transmission line according to a preferred embodiment of the present invention, the hollow portion is filled with an inert gas.

With this configuration, crushing of the hollow portion is able to be significantly reduced or prevented when the pressure in the hollow portion becomes lower. Further, in a case in which the signal conductor is exposed to the hollow portion, the oxidation of the signal conductor is significantly reduced or prevented.

In addition, in a signal transmission line according to a preferred embodiment of the present invention, the hollow portion is exposed to outside of the signal transmission line through a vent hole provided in the laminate.

With this configuration, the pressure in the hollow portion is the same as the pressure outside of the signal transmission line, which significantly reduces or prevents the hollow portion from being crushed.

In addition, in a signal transmission line according to a preferred embodiment of the present invention, the signal conductor is exposed to the hollow portion, and, on the surface of the signal conductor, the surface being exposed to the hollow portion, the signal conductor includes a protective film that significantly reduces or prevents oxidation of the signal conductor.

With this configuration, the oxidation of the signal conductor is significantly reduced or prevented.

In addition, in a signal transmission line according to a preferred embodiment of the present invention, the laminate preferably includes a portion that includes the hollow portion and a portion that does not include the hollow portion in the signal transmission direction; and the portion that does not include the hollow portion is preferably a bent portion.

With this configuration, in any bent shape, the hollow portion is not crushed.

In addition, in a signal transmission line according to a preferred embodiment of the present invention, the bent portion is preferably thinner than the portion that includes the hollow portion in the laminate.

With this configuration, the laminate is more easily bent.

In addition, in a signal transmission line according to a preferred embodiment of the present invention, the following configuration may also be provided. A plurality of signal conductors are disposed in the width direction perpendicular or substantially perpendicular to the laminating direction in the laminate. The laminate includes an intermediate holding portion that does not include the hollow portion between the plurality of signal conductors, in the width direction. The intermediate holding portion includes the reinforcing conductor.

With this configuration, in a multicore signal transmission line, the reduction of transmission loss and the ease of deformation are able to be achieved.

In addition, in a signal transmission line according to a preferred embodiment of the present invention, the reinforcing conductor provided in the intermediate holding portion is preferably grounded.

With this configuration, coupling between adjacent signal conductors is significantly reduced or prevented.

According to various preferred embodiments of the present invention, signal transmission lines having a low transmission loss and being easily deformed are provided.

The above and other elements, features, steps, characteristics and advantages of the present invention will become more apparent from the following detailed description of the preferred embodiments with reference to the attached drawings, where the same or similar features in the drawings are labeled by the same reference labels.

DETAILED DESCRIPTION OF THE PREFERRED EMBODIMENTS

Figure 1:
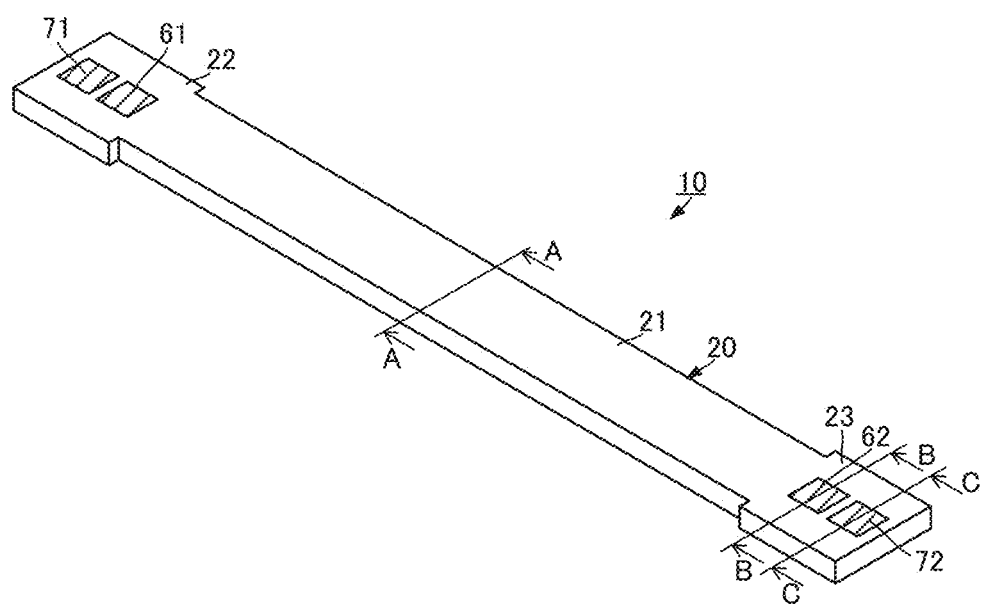
FIG. 1 is an external perspective view of a signal transmission line according to a first preferred embodiment of the present invention.
Figure 2:
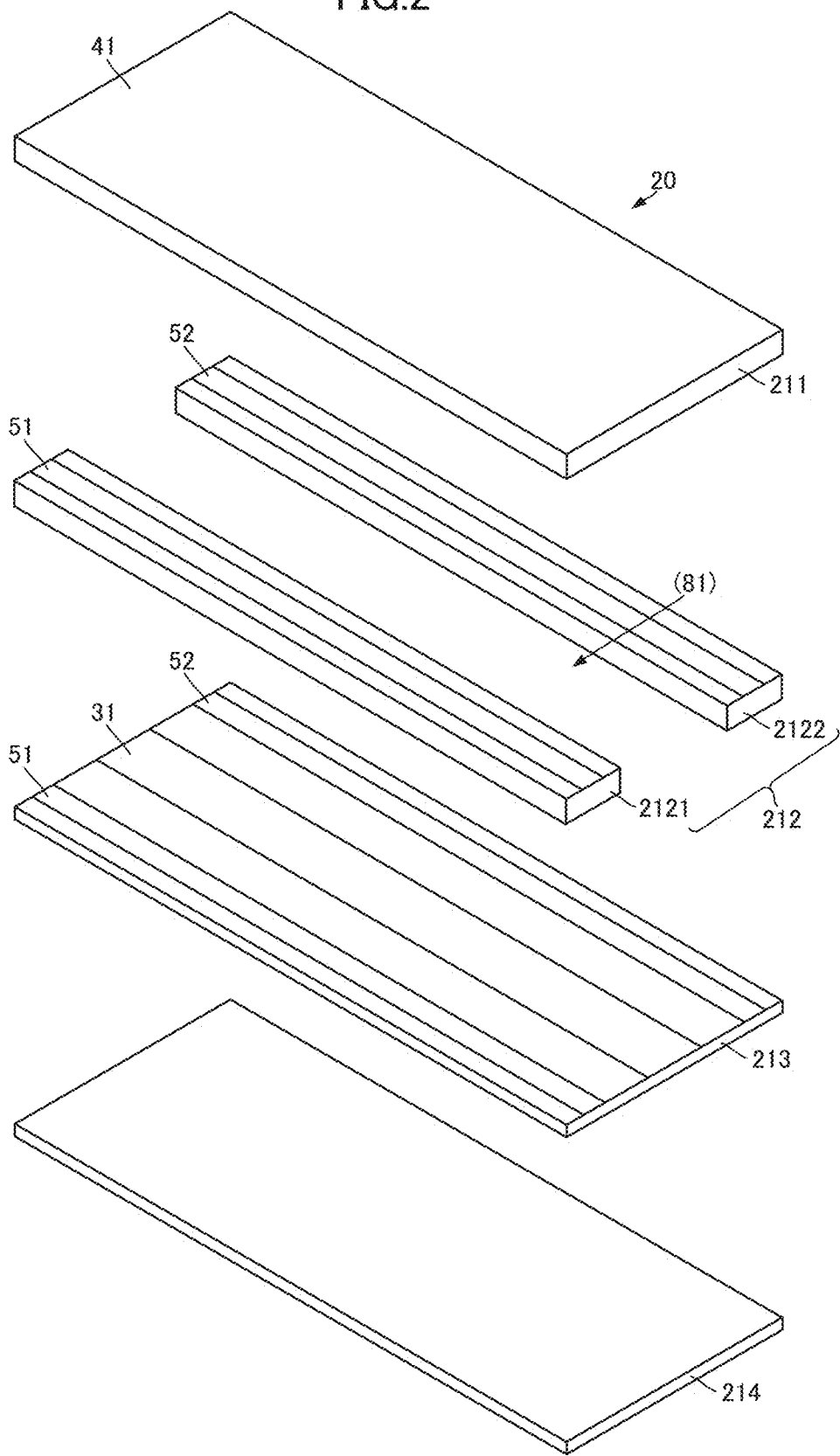
FIG. 2 is an exploded perspective view of the signal transmission line according to the first preferred embodiment of the present invention.
Figure 3A:
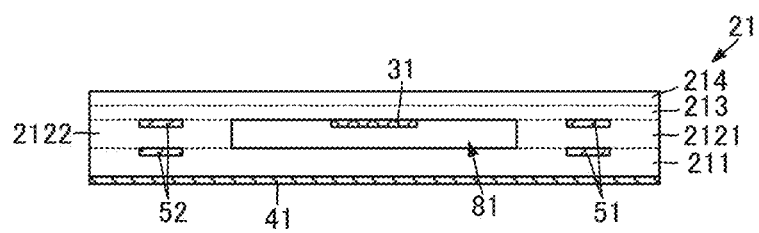
FIGS. 3A to 3C are cross-sectional views of the signal transmission line according to the first preferred embodiment of the present invention.
Figure 3B:
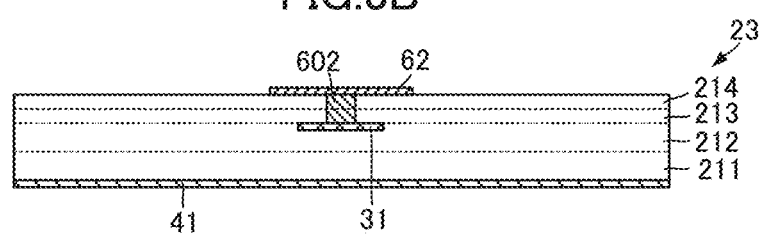
Figure 3C:
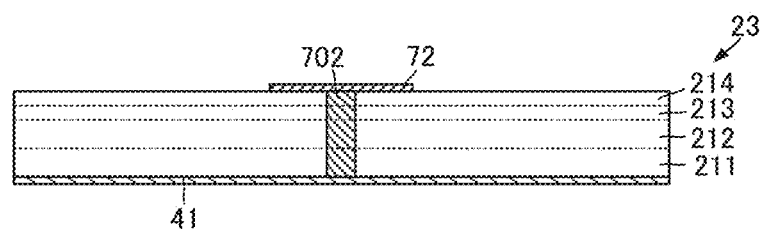

A signal transmission line according to a first preferred embodiment of the present invention will be described with reference to the drawings. FIG. 1 is an external perspective view of a signal transmission line according to the first preferred embodiment of the present invention. FIG. 2 is an exploded perspective view of a signal transmission portion of the signal transmission line according to the first preferred embodiment of the present invention. FIG. 3A is an A-A cross-sectional view of the signal transmission line as shown in FIG. 1 according to the first preferred embodiment of the present invention, FIG. 3B is a B-B cross-sectional view of the signal transmission line as shown in FIG. 1 according to the first preferred embodiment of the present invention, and FIG. 3C is a C-C cross-sectional view of the signal transmission line as shown in FIG. 1 according to the first preferred embodiment of the present invention. Features of the signal transmission line according to the first preferred embodiment shown in each of FIGS. 1, 2, 3A, 3B, and 3C that are the same as or similar to one another are denoted by the same reference characters.

As illustrated in FIG. 1, a signal transmission line 10 includes a laminate 20. The laminate 20 includes a signal transmission portion 21 and external connection portions 22 and 23. The signal transmission portion 21 and the external connection portions 22 and 23 are integrally provided. The external connecting portion 22 is provided at one end in a direction in which the signal transmission portion 21 extends. The external connecting portion 23 is provided at the other end in a direction in which the signal transmission portion 21 extends. The external connection conductor 22 includes a first surface and external connection conductors 61 and 71 provided on the first surface. The external connection conductor 23 includes a first surface and external connection conductors 62 and 72 provided on the first surface.

As illustrated in FIG. 2, the laminate 20 has flexibility and is formed by stacking and thermally pressing resin layers 211, 212, 213, and 214, the resin layers having thermoplasticity. The resin layer 214 defines a first surface of the laminate 20, and the resin layer 211 defines a second surface of the laminate 20. The resin layers 211, 212, 213, and 214 are preferably made of a material primarily including liquid crystal polymer, for example. Since the resin layers 211, 212, 213, and 214 have flexibility, the laminate 20 also has flexibility.

A portion corresponding to the signal transmission portion 21 as illustrated in FIG. 1 in the resin layer 212 includes resin layers 2121 and 2122. The resin layers 2121 and 2122 are provided at both ends in the width direction that is perpendicular or substantially perpendicular to a direction in which the laminate 20 extends, as a signal transmission direction, and that is also perpendicular or substantially perpendicular to the laminating direction. The resin layer 2121 and the resin layer 2122 are disposed at intervals. In this configuration, in the laminate 20, a hollow portion 81 surrounded by the resin layers 211, 2121, 2122, and 213 is provided. It is to be noted that, at both ends of the hollow portion 81 in a direction in which the laminate 20 extends, the resin layer 212 that defines the external connection portions 22 and 23 (FIG. 1) provides a wall surface. As a result, the hollow portion 81 is an enclosed space.

As illustrated in FIGS. 2 and 3C, a conductor 41 is provided on a surface of the resin layer 211 opposite to the resin layers 2121 and 2122 (FIG. 2) so as to cover the entire or substantially the entire surface of the resin layer 211. In other words, the conductor 41 is provided on the entire or substantially the entire area of the second surface of the laminate 20. The conductor 41 is connected to the external connection conductor 71 (FIG. 1) through an interlayer connection conductor, and is connected to the external connection conductor 72 through an interlayer connection conductor 702.

As illustrated in FIG. 2, on the surfaces of the resin layers 2121 and 2122 on the side of the resin layer 211, reinforcing conductors 51 and 52 are respectively provided. The reinforcing conductors 51 and 52 extend in a direction in which the laminate 20 extends, as the signal transmission direction. The reinforcing conductors 51 and 52 are disposed at a portion that corresponds to at least the signal transmission portion 21. The width of the reinforcing conductors 51 and 52 is preferably smaller than the width of the resin layers 2121 and 2122. The reinforcing conductor 51 is disposed in the center or substantially the center of the width direction of the resin layer 2121, and the reinforcing conductor 52 is disposed in the center or substantially the center of the width direction of the resin layer 2122.

On the surface of the resin layer 213 on the side of the resin layer 212, the signal conductor 31 and the reinforcing conductors 51 and 52 are provided. The signal conductor 31 and the reinforcing conductors 51 and 52 extend in a direction in which the laminate 20 extends, as the signal transmission direction. The signal conductor 31 extends to the external connection portions 22 and 23 in addition to the signal transmission portion 21. The reinforcing conductors 51 and 52 are provided in the signal transmission portion 21. The signal conductor 31 is disposed in the center or substantially the center of the width direction of the resin layer 213. In other words, the signal conductor 31 is disposed at a portion that is not in contact with the resin layers 2121 and 2122 in the resin layer 213. As a result, the signal conductor 31 overlaps with the hollow portion 81 in a plan view from a surface (the first surface and the second surface) perpendicular or substantially perpendicular to the laminate 20 in the laminating direction. In addition, the signal conductor 31 is exposed to the hollow portion 81. One end in a direction in which the signal conductor 31 extends is connected to the external connection conductor 61 (FIG. 1) through an interlayer connection conductor. Another end in a direction in which the signal conductor 31 extends is connected to the external connection conductor 62 through an interlayer connection conductor 602 as illustrated in FIG. 3B.

The reinforcing conductor 51 of the resin layer 213, in the above plan view, is disposed at a position that overlaps with the reinforcing conductor 51 of the resin layer 2121. The reinforcing conductor 52 of the resin layer 213, in the above plan view, is disposed at a position that overlaps with the reinforcing conductor 52 of the resin layer 2122.

With such a configuration in which the conductor 41 (FIGS. 3B and 3C) is a ground conductor, a microstrip line in which the signal conductor 31 faces the conductor 41 through the hollow portion 81 is provided as illustrated in FIG. 3A. Then, the signal conductor 31 is exposed to the hollow portion 81 preferably being a gas layer, such as an air layer, for example, so that the occurrence of dielectric loss is significantly reduced or prevented, and a microstrip line in which transmission loss is significantly reduced or prevented is obtained. In addition, since the signal conductor 31 is provided in the laminate 20, the signal conductor 31 is not exposed to an external environment, so that deterioration of characteristics, such as an increase in transmission loss due to oxidation of the signal conductor 31, is significantly reduced or prevented.

With the above-described configuration, the reinforcing conductors 51 and 52 are positioned so as not to overlap with the hollow portion 81, so that the shape of the hollow portion 81 is able to be maintained while the laminate 20 has flexibility.

It is to be noted that, while the present preferred embodiment illustrates a mode in which the reinforcing conductors 51 and 52 are preferably provided in two layers, for example, the reinforcing conductors 51 and 52 may be provided in one layer or may be formed in three or more layers. For example, a pair of the reinforcing conductors 51 and 52 of any of the resin layers 212 and 213 may not be provided.

Figure 4:
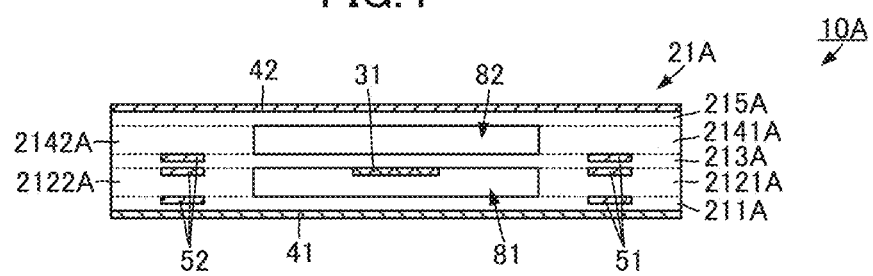
FIG. 4 is a cross-sectional view of a signal transmission line according to a second preferred embodiment of the present invention.

Subsequently, a signal transmission line according to a second preferred embodiment of the present invention will be described with reference to the drawings. FIG. 4 is a cross-sectional view of a signal transmission line according to the second preferred embodiment of the present invention.

A signal transmission line 10A according to the second preferred embodiment of the present invention is a stripline while the signal transmission line 10 according to the first preferred embodiment of the present invention is a microstrip line. It is to be noted that the material and other characteristics of a resin layer are preferably the same or substantially the same as the material and other characteristics of the signal transmission line according to the first preferred embodiment of the present invention, and overlapping description will be omitted. Features of the signal transmission line according to the second preferred embodiment shown in FIG. 4 that are the same as or similar to the features shown in the signal transmission line according to the first preferred embodiment shown in FIGS. 1, 2, and 3A-3C are denoted by the same reference characters. In addition, although the following preferred embodiments including the present preferred embodiment specifically illustrate the shape of the signal transmission portion, an external connection portion is able to be provided by the same or substantially the same layer structure as the signal transmission portion and the structure with which a hollow portion and a reinforcing conductor are not provided, and the illustration and description will be omitted.

A signal transmission portion 21A of the laminate includes resin layers 211A, 2121A, 2122A, 213A, 2141A, 2142A, and 215A.

The resin layers 2121A and 2122A are provided between the resin layer 211A and the resin layer 213A. The resin layer 2121A is provided at one end in the width direction of the resin layers 211A and 213A. The resin layer 2122A is provided at another end in the width direction of the resin layers 211A and 213A. The resin layer 2121A and the resin layer 2122A are disposed at intervals in the width direction of the signal transmission portion 21A of the laminate. The resin layers 211A, 2121A, 2122A, and 213A define a hollow portion 81.

The resin layers 2141A and 2142A are provided between the resin layer 213A and the resin layer 215A. The resin layer 2141A is provided at one end in the width direction of the resin layers 213A and 215A. The resin layer 2142A is provided at another end in the width direction of the resin layers 213A and 215A. The resin layer 2141A and the resin layer 2142A are disposed at intervals in the width direction of the signal transmission portion 21A of the laminate. The resin layers 213A, 2141A, 2142A, and 215A define a hollow portion 82. The hollow portion 81 and the hollow portion 82 overlap with each other in a plan view.

The signal conductor 31 is provided on the side of the hollow portion 81 in the resin layer 213A, and is exposed to the hollow portion 81.

The conductor 41 is provided on a surface opposite to the side of the resin layers 2121A and 2122A in the resin layer 211A. The conductor 42 is provided on a surface opposite to the side of the resin layers 2141A and 2142A in the resin layer 215A. With such a configuration that the conductors 41 and 42 are a ground conductor, a stripline in which the signal conductor 31 is provided between the conductors 41 and 42 is obtained. In such a case, the hollow portion 81 is provided between the signal conductor 31 and the conductor 41, and the hollow portion 82 is provided between the signal conductor 31 and the conductor 42, so that dielectric loss is significantly reduced or prevented and transmission loss is able to be significantly reduced or prevented. In addition, similarly to the first preferred embodiment, the signal conductor 31 is able to be protected from the external environment.

The reinforcing conductor 51, in a plan view, is disposed at a portion with which the resin layers 211A, 2121A, 213A, 2141A, and 215A overlap. The reinforcing conductor 52, in a plan view, is disposed at a portion with which the resin layers 211A, 2122A, 213A, 2142A, and 215A overlap. In other words, the reinforcing conductors 51 and 52, in a plan view, are disposed at portions (hollow-shaped holding portions) that do not overlap with the hollow portions 81 and 82. With such a configuration, as is similar to the first preferred embodiment, the shape of the hollow portions 81 and 82 is able to be maintained while the flexibility as a laminate is maintained.

Figure 5:
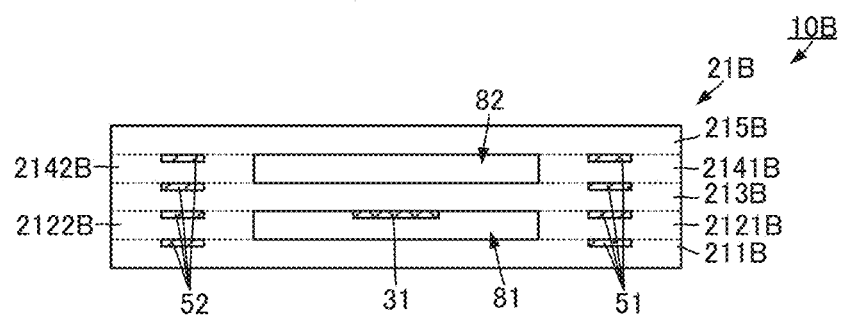
FIG. 5 is a cross-sectional view of a signal transmission line according to a third preferred embodiment of the present invention.

Subsequently, a signal transmission line according to a third preferred embodiment of the present invention will be described with reference to the drawings. FIG. 5 is a cross-sectional view of a signal transmission line according to the third preferred embodiment of the present invention.

A signal transmission line 10B according to the third preferred embodiment of the present invention does not include the conductors 41 and 42 that are included in the signal transmission line 10A according to the second preferred embodiment of the present invention. In other words, the signal transmission line 10B is a single-line signal transmission line. Features of the signal transmission line according to the third preferred embodiment shown in FIG. 5 that are the same as or similar to the features shown in the signal transmission line according to the second preferred embodiment shown in FIG. 4 are denoted by the same reference characters.

A signal transmission portion 21B of the laminate includes resin layers 211B, 2121B, 2122B, 213B, 2141B, 2142B, and 215B. The layered structure of the resin layers 211B, 2121B, 2122B, 213B, 2141B, 2142B, and 215B is preferably the same or substantially the same as the layered structure of the resin layers 211A, 2121A, 2122A, 213A, 2141A, 2142A, and 215A in the signal transmission portion 21A according to the second preferred embodiment of the present invention.

The signal conductor 31 is exposed to the hollow portion 81. The reinforcing conductors 51 and 52 include four layers at portions that do not overlap with the hollow portions 81 and 82 in a plan view.

Even with such a configuration, the transmission loss of the signal conductor 31 is able to be significantly reduced or prevented, and the signal transmission line 10B that has flexibility is obtained.

It is to be noted that it is also possible to omit the resin layers 2141B, 2142B, and 215B in the present preferred embodiment.

Figure 6:
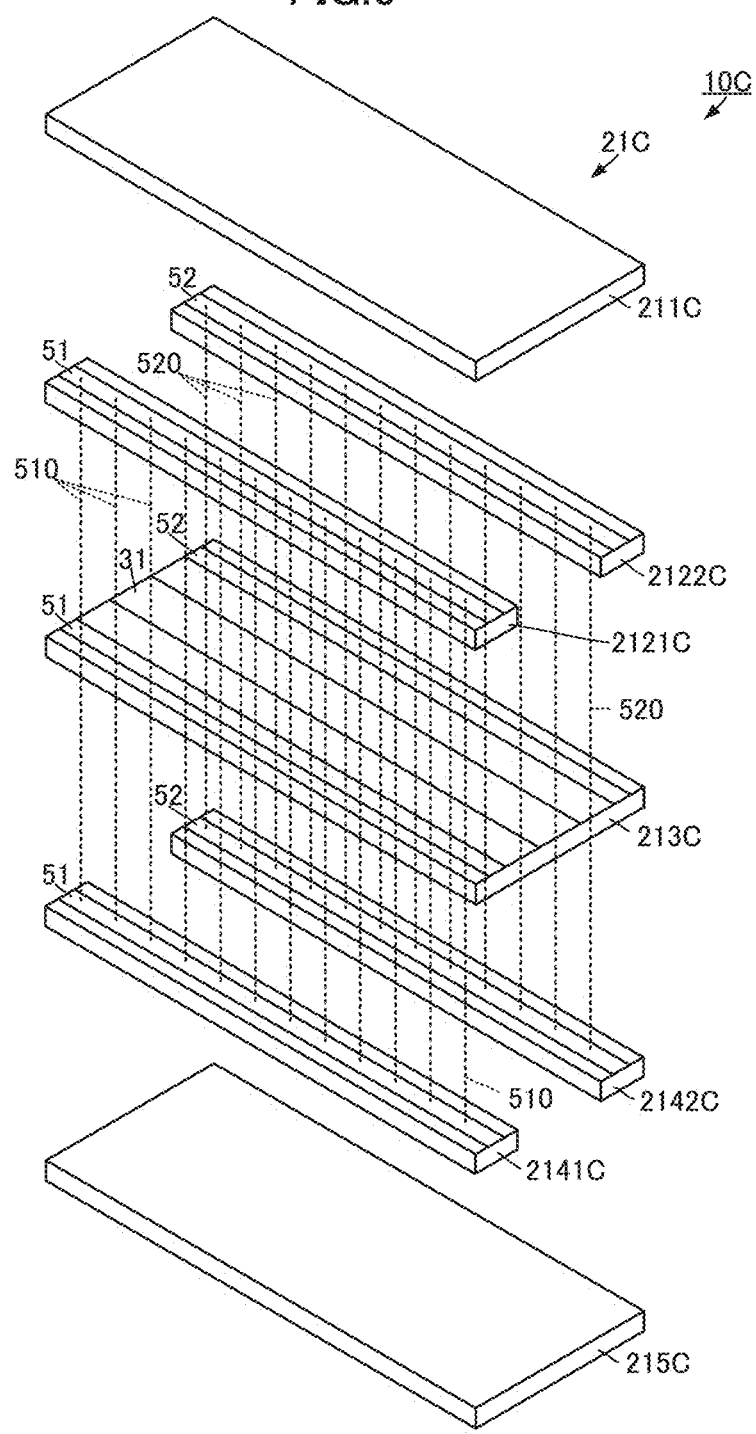
FIG. 6 is an exploded perspective view of a signal transmission portion of a signal transmission line according to a fourth preferred embodiment of the present invention.
Figure 7:
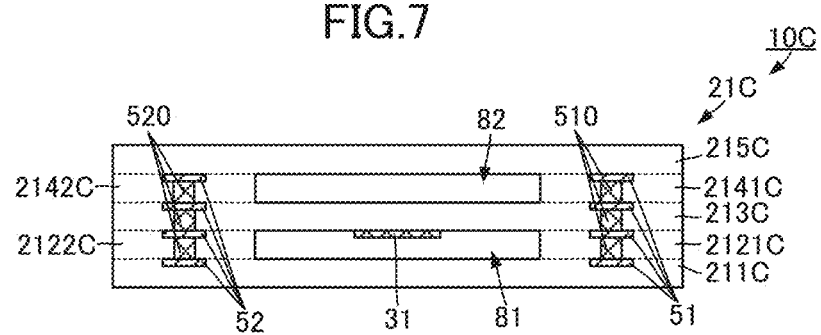
FIG. 7 is a cross-sectional view of the signal transmission portion of the signal transmission line according to the fourth preferred embodiment of the present invention.

Subsequently, a signal transmission line according to a fourth preferred embodiment of the present invention will be described with reference to the drawings. FIG. 6 is an exploded perspective view of a signal transmission portion of a signal transmission line according to the fourth preferred embodiment of the present invention. FIG. 7 is a cross-sectional view of the signal transmission portion of the signal transmission line according to the fourth preferred embodiment of the present invention. FIG. 7 illustrates a portion at which an interlayer connection conductor is arranged.

A signal transmission line 10C according to the fourth preferred embodiment of the present invention is obtained by adding interlayer connection conductors 510 and 520 to the signal transmission line 10B according to the third preferred embodiment of the present invention. Other configurations are preferably the same or substantially the same as the configurations of the signal transmission line 10B according to the third preferred embodiment of the present invention, and overlapping description will be omitted. Features of the signal transmission line according to the fourth preferred embodiment shown in FIGS. 6 and 7 that are the same as or similar to the features of the signal transmission line according to the third preferred embodiment shown in FIG. 5 are denoted by the same reference characters.

A signal transmission portion 21C of the laminate includes resin layers 211C, 2121C, 2122C, 213C, 2141C, 2142C, and 215C. The resin layers 211C, 2121C, 2122C, 213C, 2141C, 2142C, and 215C correspond to the resin layers 211B, 2121B, 2122B, 213B, 2141B, 2142B, and 215B, respectively.

The reinforcing conductor 51 includes plural reinforcing conductors 51 and the reinforcing conductors 51 of each layer are connected by the interlayer connection conductor 510. The reinforcing conductor 52 includes plural reinforcing conductors 52 and the reinforcing conductors 52 of each layer are connected by the interlayer connection conductor 520. A plurality of interlayer connection conductors 510 and 520 are provided at intervals in a direction in which the signal transmission portion 21C extends.

With such a configuration, the strength of the holding portion that supports the hollow portions 81 and 82 (FIG. 7) is able to be further increased, so that it is possible to make the hollow portions 81 and 82 more difficult to be crushed. In such a case, the balance between the strength of the holding portion and the flexibility is able to be properly adjusted by properly adjusting the intervals of the plurality of the interlayer connection conductors 510 and 520.

It is to be noted that the configuration of the present preferred embodiment is applicable to the structure of the microstrip line and the structure of the stripline according to the first and second preferred embodiments of the present invention. At this time, the reinforcing conductors 51 and 52 may be connected or may not be connected to the conductor 41 and the conductor 42 being ground conductors.

Figure 8:
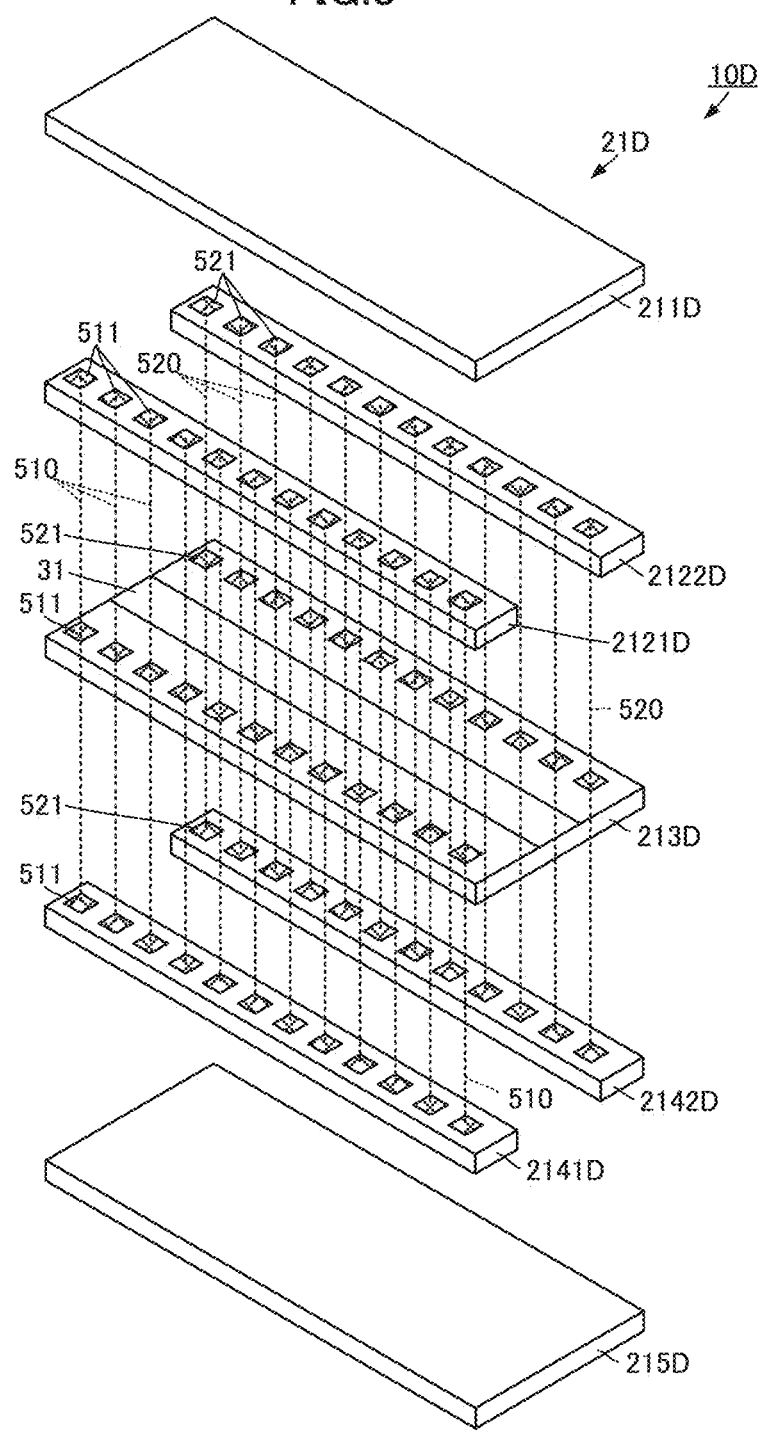
FIG. 8 is an exploded perspective view of a signal transmission portion of a signal transmission line according to a fifth preferred embodiment of the present invention.
Figure 9A:
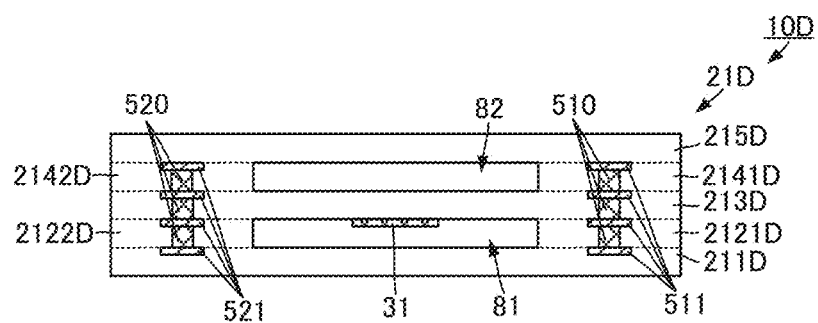
FIGS. 9A and 9B are cross-sectional views of the signal transmission portion of the signal transmission line according to the fifth preferred embodiment of the present invention.
Figure 9B:
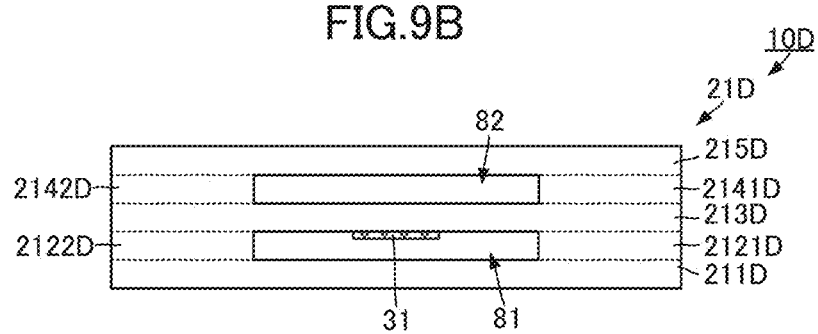

Subsequently, a signal transmission line according to a fifth preferred embodiment of the present invention will be described with reference to the drawings. FIG. 8 is an exploded perspective view of a signal transmission portion of a signal transmission line according to the fifth preferred embodiment of the present invention. FIGS. 9A and 9B are cross-sectional views of the signal transmission portion of the signal transmission line according to the fifth preferred embodiment of the present invention. FIG. 9A illustrates a portion at which a reinforcing conductor and an interlayer connection conductor are provided. FIG. 9B illustrates a portion at which a reinforcing conductor and an interlayer connection conductor are not provided.

A signal transmission line 10D according to the fifth preferred embodiment of the present invention differs with respect to reinforcing conductors 511 and 521 (FIGS. 8 and 9A) as compared to the signal transmission line 10C according to the fourth preferred embodiment of the present invention. Other configurations are preferably the same or substantially the same as the configurations of the signal transmission line 10C according to the fourth preferred embodiment of the present invention, and overlapping description will be omitted. Features of the signal transmission line according to the fifth preferred embodiment shown in FIGS. 8, 9A, and 9B that are the same as or similar to the features of the signal transmission line according to the fourth preferred embodiment shown in FIGS. 6 and 7 are denoted by the same reference characters.

A signal transmission portion 21D of the laminate includes resin layers 211D, 2121D, 2122D, 213D, 2141D, 2142D, and 215D. The resin layers 211D, 2121D, 2122D, 213D, 2141D, 2142D, and 215D correspond to the resin layers 211C, 2121C, 2122C, 213C, 2141C, 2142C, and 215C, of the fourth preferred embodiment, respectively.

The reinforcing conductors 511 and 521 of each layer are a plurality of conductor patterns provided at intervals in a direction in which the signal transmission line 10D extends. The reinforcing conductor 511 includes plural reinforcing conductors 511, and the reinforcing conductors 511 of each layer that overlap with each other in a plan view are connected by the interlayer connection conductor 510 (FIGS. 8 and 9A). The reinforcing conductor 521 includes plural reinforcing conductors 521, and the reinforcing conductors 521 of each layer that overlap with each other in a plan view are connected by the interlayer connection conductor 520 (FIGS. 8 and 9A).

According to such a configuration, a portion of which the strength is high since the reinforcing conductors 511 and 521 and the interlayer connection conductors 510 and 520 are provided as illustrated in FIG. 9A and a portion of which the strength is low since the reinforcing conductors 511 and 521 and the interlayer connection conductors 510 and 520 are not provided as illustrated in FIG. 9B are alternatively provided in the direction in which the signal transmission line 10D extends.

As a result, the portion in which the reinforcing conductors 511 and 521 and the interlayer connection conductors 510 and 520 are not provided is flexible, and the portion in which the reinforcing conductors 511 and 521 and the interlayer connection conductors 510 and 520 are provided maintains the strength of the hollow portions 81 and 82.

The configuration of the present preferred embodiment is also applicable to the structure of the microstrip line and the structure of the stripline according to the first and second preferred embodiments of the present invention. The reinforcing conductors 511 and 521 may be connected or may not be connected to the conductor 41 and the conductor 42 being ground conductors.

Figure 10:
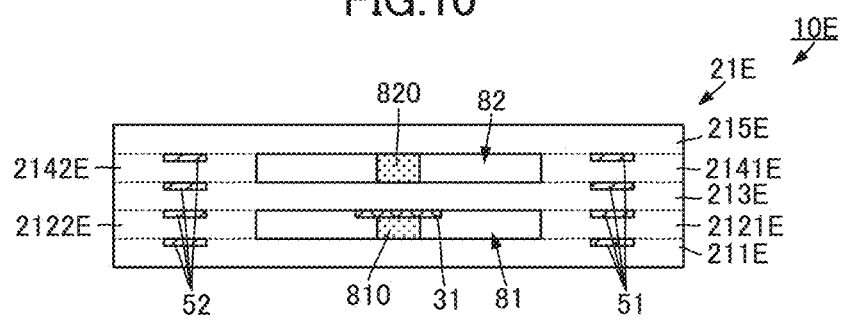
FIG. 10 is a cross-sectional view of a signal transmission portion of a signal transmission line according to a sixth preferred embodiment of the present invention.

Subsequently, a signal transmission line according to a sixth preferred embodiment of the present invention will be described with reference to the drawings. FIG. 10 is a cross-sectional view of a signal transmission portion of a signal transmission line according to the sixth preferred embodiment of the present invention.

A signal transmission line 10E according to the sixth preferred embodiment of the present invention is obtained by adding reinforcing insulating members 810 and 820 to the signal transmission line 10B according to the third preferred embodiment of the present invention. Other configurations are preferably the same or substantially the same as the configurations of the signal transmission line 10B according to the third preferred embodiment of the present invention, and overlapping description will be omitted. Features of the signal transmission line according to the sixth preferred embodiment shown in FIG. 10 that are the same as or similar to the features of the signal transmission line according to the third preferred embodiment shown in FIG. 5 are denoted by the same reference characters.

A signal transmission portion 21E of the laminate includes resin layers 211E, 2121E, 2122E, 213E, 2141E, 2142E, and 215E. The resin layers 211E, 2121E, 2122E, 213E, 2141E, 2142E, and 215E correspond to the resin layers 211B, 2121B, 2122B, 213B, 2141B, 2142B, and 215B of the third preferred embodiment, respectively.

The material of the reinforcing insulating members 810 and 820 may be the same as or may be different from the material of the resin layers 211E, 2121E, 2122E, 213E, 2141E, 2142E, and 215E. In a case of the same material, the reinforcing insulating members 810 and 820 are preferably made of the same material as the resin layers 2121E and 2122E and the resin layers 2141E and 2142E. As a result, the resin layers 2121E, 2122E, 2141E, and 2142E and the reinforcing insulating members 810 and 820 are able to be integrally provided. In addition, the material of the reinforcing insulating members 810 and 820 is also preferably the same as the material of the resin layers 211E and 215E, so that it is possible to reduce or prevent delamination due to bending stress when the reinforcing insulating members 810 and 820 are bent. On the other hand, in a case of different materials, a material of which the elasticity is higher than the elasticity of the material of the resin layers 211E, 2121E, 2122E, 213E, 2141E, 2142E, and 215E is preferably used.

The reinforcing insulating member 810 is disposed in the hollow portion 81, and overlaps with the signal conductor 31 in a plan view. The reinforcing insulating member 810 is in contact with the signal conductor 31 and the resin layer 211E. As a result, the shape of the hollow portion 81 is maintained by the reinforcing insulating member 810.

The reinforcing insulating member 820 is disposed in the hollow portion 82, and overlaps with the signal conductor 31 in a plan view. The reinforcing insulating member 820 is in contact with the resin layers 213E and 215E. As a result, the shape of the hollow portion 82 is maintained by the reinforcing insulating member 820.

It is to be noted that the reinforcing insulating members 810 and 820 may be continuously provided in the direction in which the signal transmission portion 21E extends or may be intermittently provided at intervals. It is also to be noted that the reinforcing insulating members 810 and 820 are able to reduce transmission loss by preventing contact with an end portion in the width direction of the signal conductor 31 on which charge concentrates.

In this manner, with the configuration according to the present preferred embodiment, the signal transmission line 10E in which a hollow portion is even more difficult to be crushed is able to be obtained.

The configuration of the present preferred embodiment is also applicable to the structure of the microstrip line and the structure of the stripline according to the first and second preferred embodiments of the present invention.

Figure 11:
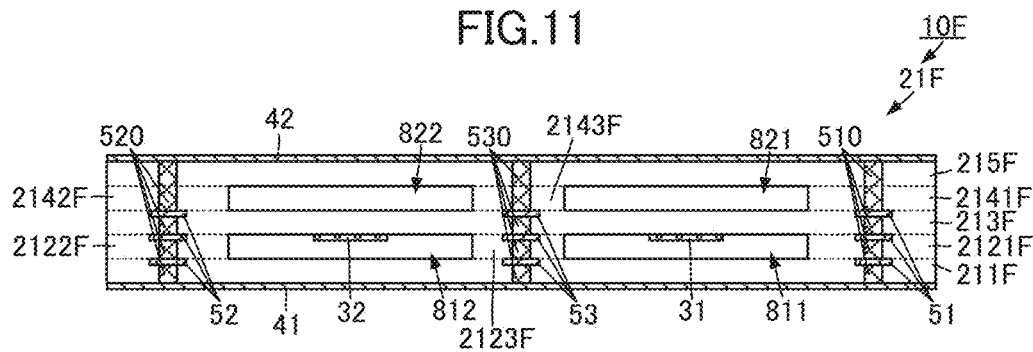
FIG. 11 is a cross-sectional view of a signal transmission portion of a signal transmission line according to a seventh preferred embodiment of the present invention.

Subsequently, a signal transmission line according to a seventh preferred embodiment of the present invention will be described with reference to the drawings. FIG. 11 is a cross-sectional view of a signal transmission portion of a signal transmission line according to the seventh preferred embodiment of the present invention.

A signal transmission line 10F according to the seventh preferred embodiment includes a plurality of signal conductors 31 and 32, and the basic structure of each of the signal conductors 31 and 32 is obtained by combining the signal transmission line 10A according to the second preferred embodiment and the signal transmission line 10C according to the fourth preferred embodiment.

A signal transmission portion 21F of the laminate includes resin layers 211F, 2121F, 2122F, 2123F, 213F, 2141F, 2142F, 2143F, and 215F.

The resin layers 2121F, 2122F, and 2123F are provided between the resin layers 211F and 213F. The resin layer 2121F is provided at one end in the width direction of the resin layers 211F and 213F. The resin layer 2122F is provided at another end in the width direction of the resin layers 211F and 213F. The resin layer 2123F is provided at an intermediate position (a center or substantially at a center position in FIG. 11) in the width direction of the resin layers 211F and 213F. The resin layers 2121F, 2122F, and 2123F are spaced apart from each other. This configuration provides the hollow portions 811 and 812. The hollow portion 811 is defined by the resin layers 211F, 2121F, 2123F, and 213F. The hollow portion 812 is defined by the resin layers 211F, 2122F, 2123F, and 213F.

The resin layers 2141F, 2142F, and 2143F are provided between the resin layers 213F and 215F. The resin layer 2141F is provided at one end in the width direction of the resin layers 213F and 215F. The resin layer 2142F is provided at another end in the width direction of the resin layers 213F and 215F. The resin layer 2143F is provided at an intermediate position (a center or substantially at a center position in FIG. 11) in the width direction of the resin layers 213F and 215F. The resin layers 2141F, 2142F, and 2143F are spaced apart from each other. This configuration provides the hollow portions 821 and 822. The hollow portion 821 is defined by the resin layers 213F, 2141F, 2143F, and 215F. The hollow portion 822 is defined by the resin layers 213F, 2142F, 2143F, and 215F.

The signal conductor 31 is exposed to the hollow portion 811. The signal conductor 32 is exposed to the hollow portion 812. The conductor 41 defining a ground conductor is provided on a surface opposite to the side of the resin layers 2121F, 2122F, and 2123F in the resin layer 211F. The conductor 42 defining a ground conductor is provided on a surface opposite to the side of the resin layers 2141F, 2142F, and 2143F in the resin layer 215F.

The reinforcing conductor 51 is disposed in three layers at a portion with which the resin layers 211F, 2121F, 213F, 2141F, and 215F overlap. The reinforcing conductor 51 of three layers is connected by a plurality of interlayer connection conductors 510 provided at intervals in the direction in which the signal transmission portion 21F extends. The interlayer connection conductor 510 is also connected to the conductors 41 and 42.

The reinforcing conductor 52 is disposed in three layers at a portion with which the resin layers 211F, 2122F, 213F, 2142F, and 215F overlap. The reinforcing conductor 52 of three layers is connected by the interlayer connection conductor 520. The interlayer connection conductor 520 is also connected to the conductors 41 and 42.

The reinforcing conductor 53 is disposed in three layers at a portion with which the resin layers 211F, 2123F, 213F, 2143F, and 215F overlap. The reinforcing conductor 53 of three layers is connected by the interlayer connection conductor 530. The interlayer connection conductor 530 is also connected to the conductors 41 and 42.

With such a configuration, the signal transmission line 10F being a multicore, and having low transmission loss while having flexibility is obtained. In addition, in the configuration, the reinforcing conductor 53 and the interlayer connection conductor 530 that are connected to the conductors 41 and 42 defining ground conductors are provided between the signal conductors 31 and 32. Accordingly, coupling between the signal conductors 31 and 32 is significantly reduced or prevented, and high isolation between the signal conductors 31 and 32 is obtained.

The configuration of the present preferred embodiment is applicable to the structure of the microstrip line according to the first preferred embodiment of the present invention.

Figure 12:
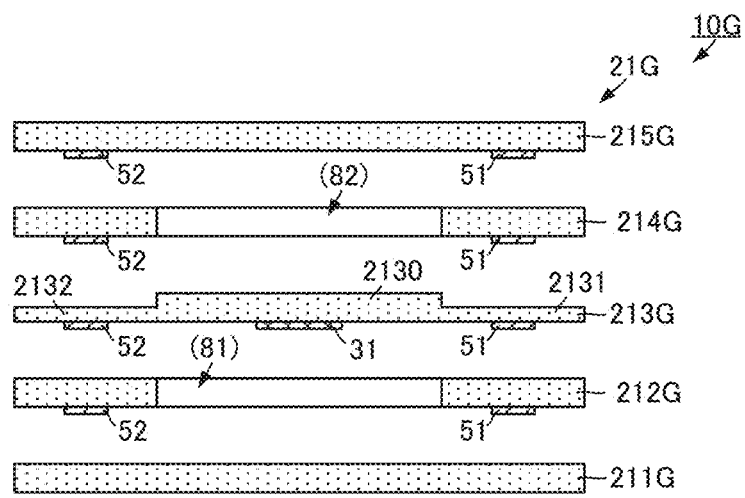
FIG. 12 is an exploded perspective view of a signal transmission portion of a signal transmission line according to an eighth preferred embodiment of the present invention.

Subsequently, a signal transmission line according to an eighth preferred embodiment of the present invention will be described with reference to the drawings. FIG. 12 is an exploded perspective view of a signal transmission portion of a signal transmission line according to the eighth preferred embodiment of the present invention.

A signal transmission line 10G according to the eighth preferred embodiment of the present invention differs in structure with respect to the resin layer 213G on which the signal conductor 31 is provided as compared to the signal transmission line 10B according to the third preferred embodiment of the present invention. Other configurations are preferably the same or substantially the same as the configurations of the signal transmission line 10B according to the third preferred embodiment of the present invention, and overlapping description will be omitted. Features of the signal transmission line according to the eighth preferred embodiment shown in FIGS. 11 and 12 that are the same as or similar to the features of the signal transmission line according to the third preferred embodiment shown in FIG. 5 are denoted by the same reference characters.

A signal transmission portion 21G of the laminate includes resin layers 211G, 212G, 213G, 214G, and 215G. The resin layers 211G, 212G, 213G, 214G, and 215G correspond to the resin layers 211B, 212B (the portion defined by the resin layers 2121B and 2122B), 213B, 214B, and 215B of the third preferred embodiment, respectively.

In the resin layer 213G, in a plan view, the thickness of a portion that does not overlap with the hollow portions 81 and 82, that is, portions 2131 and 2132 defining holding portions is preferably smaller than the thickness of a portion 2130 that overlaps with the hollow portions 81 and 82.

With such a configuration, when the resin layers 211G, 212G, 213G, 214G, and 215G are stacked and thermally pressed, resin is able to be significantly reduced or prevented from pushing out from the holding portion including a large number of resin layers to the side of the hollow portions 81 and 82, and the portion 2130 that overlaps with the hollow portions 81 and 82 at which the signal conductor 31 is provided is able to be significantly reduced or prevented from deforming. As a result, the signal conductor 31 is able to be structured and configured in a desired shape and reliably provided at a desired position, and reliably obtains desired transmission characteristics.

The configuration of the present preferred embodiment is also applicable to the structure of the microstrip line and the structure of the stripline according to the first and second preferred embodiments of the present invention.

Figure 13:
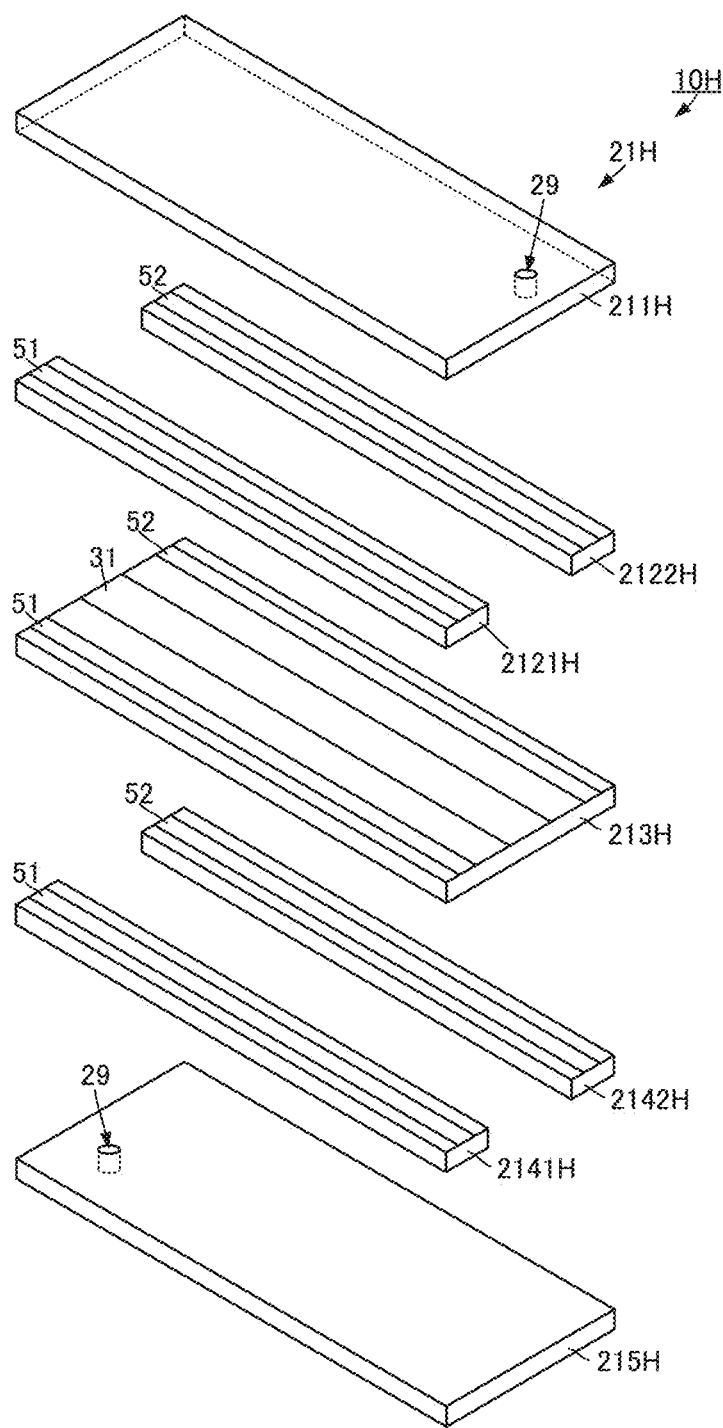
FIG. 13 is an exploded perspective view of a signal transmission portion of a signal transmission line according to a ninth preferred embodiment of the present invention.
Figure 14:
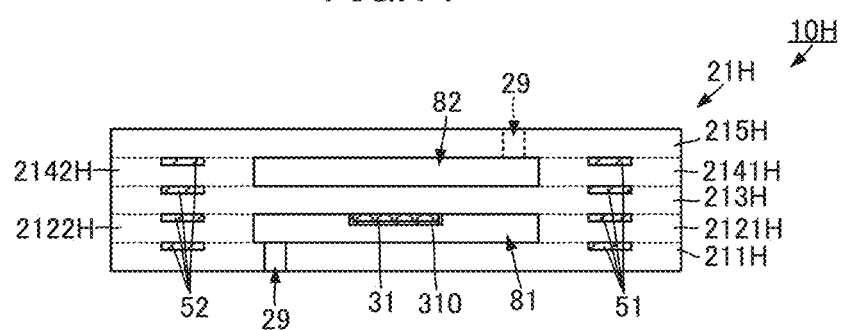
FIG. 14 is a cross-sectional view of the signal transmission portion of the signal transmission line according to the ninth preferred embodiment of the present invention.

Subsequently, a signal transmission line according to a ninth preferred embodiment of the present invention will be described with reference to the drawings. FIG. 13 is an exploded perspective view of a signal transmission portion of a signal transmission line according to the ninth preferred embodiment of the present invention. FIG. 14 is a cross-sectional view of the signal transmission portion of the signal transmission line according to the ninth preferred embodiment of the present invention. It is to be noted that the protective film of the signal conductor is omitted in FIG. 13.

A signal transmission line 10H according to the ninth preferred embodiment of the present invention is obtained by adding a vent hole 29 and a protective film 310 (FIG. 14) to the signal transmission line 10B according to the third preferred embodiment of the present invention. Other configurations are preferably the same or substantially the same as the configurations of the signal transmission line 10B according to the third preferred embodiment of the present invention, and overlapping description will be omitted. Features of the signal transmission line according to the ninth preferred embodiment shown in FIGS. 13 and 14 that are the same as or similar to the features of the signal transmission line according to the third preferred embodiment shown in FIG. 5 are denoted by the same reference characters.

A signal transmission portion 21H of the laminate includes resin layers 211H, 2121H, 2122H, 213H, 2141H, 2142H, and 215H. The resin layers 211H, 2121H, 2122H, 213H, 2141H, 2142H, and 215H correspond to the resin layers 211B, 2121B, 2122B, 213B, 2141B, 2142B, and 215B of the third preferred embodiment, respectively.

The resin layers 211H and 215H each include a vent hole 29 penetrating in the thickness direction, respectively. As a result, the hollow portions 81 and 82 (FIG. 14) are exposed to the outside through the vent hole 29, respectively. With such a vent hole 29, the shape of the hollow portions 81 and 82 (FIG. 14) is able to be significantly reduced or prevented from changing due to a pressure difference at a time of temperature change, such as when the signal transmission line 10H is mounted on an external circuit board.

The protective film 310 is provided on the surface of the signal conductor 31 on the side of the hollow portion 81. The protective film 310 may preferably be provided by plating with a stable metal, such as precious metals, for example. As a result, even when the hollow portion 81 is connected to the outside, deterioration of characteristics due to oxidation of the signal conductor 31 or other factors is able to be significantly reduced or prevented.

The configuration of the present preferred embodiment is also applicable to the structure of the microstrip line and the structure of the stripline according to the first and second preferred embodiments of the present invention.

In addition, the structure including the protective film 310 of the present preferred embodiment is also applicable to the signal transmission line according to other preferred embodiments of the present invention.

Figure 15:
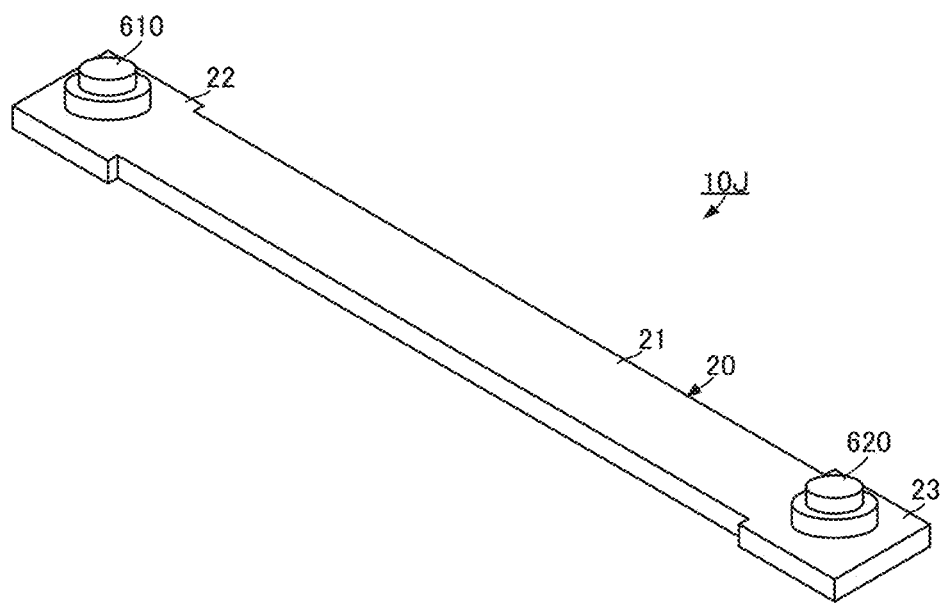
FIG. 15 is an external perspective view of a signal transmission line according to a tenth preferred embodiment of the present invention.

Subsequently, a signal transmission line according to a tenth preferred embodiment of the present invention will be described with reference to the drawings. FIG. 15 is an external perspective view of a signal transmission line according to the tenth preferred embodiment of the present invention.

A signal transmission line 10J according to the tenth preferred embodiment of the present invention is obtained by adding connectors 610 and 620 to the signal transmission line 10 according to the first preferred embodiment of the present invention. Other configurations are preferably the same or substantially the same as the configurations of the signal transmission line 10 according to the first preferred embodiment of the present invention, and overlapping description will be omitted. Features of the signal transmission line according to the tenth preferred embodiment shown in FIG. 15 that are the same as or similar to the features of the signal transmission line according to the first preferred embodiment shown in FIGS. 1, 2, and 3A-3C are denoted by the same reference characters.

The connector 610 is provided at a first surface of the external connection portion 22 of the laminate 20. While not illustrated, the center conductor of the connector 610 is connected to the external connection conductor 61 (FIG. 1), and the outer peripheral conductor of the connector 610 is connected to the external connection conductor 71 (FIG. 1). In addition, while not illustrated, the center conductor of the connector 620 is connected to the external connection conductor 62, and the outer peripheral conductor of the connector 620 is connected to the external connection conductor 72 as illustrated in FIG. 1.

Even with such a configuration, the same operational effects and advantages as the operational effects and advantages of the above-described preferred embodiments are able to be obtained. In addition, the signal transmission line 10J is able to be easily connected to the connector of an external circuit board by the connectors 610 and 620.

It is to be noted that the structure of the present preferred embodiment is also applicable to the signal transmission line of each of the second and subsequent preferred embodiments.

Figure 16:
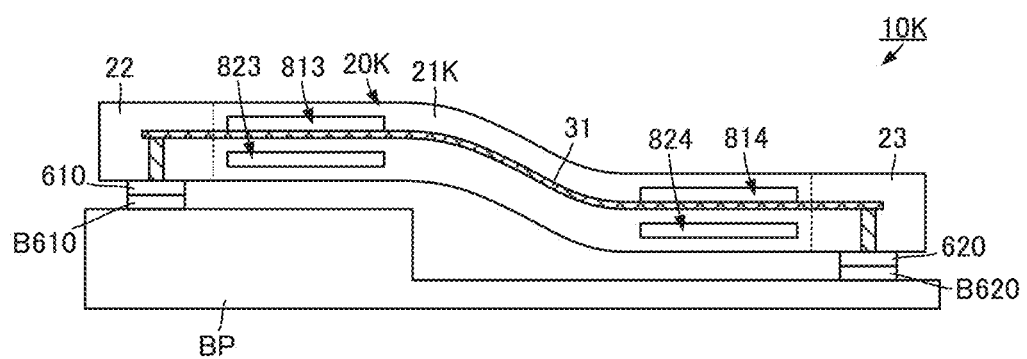
FIG. 16 is a side cross-sectional view of a structure of a signal transmission line according to an eleventh preferred embodiment of the present invention.

Subsequently, a signal transmission line according to an eleventh preferred embodiment of the present invention will be described with reference to the drawings. FIG. 16 is a side cross-sectional view of a structure of a signal transmission line according to the eleventh preferred embodiment of the present invention.

A signal transmission line 10K according to the eleventh preferred embodiment of the present invention is obtained by adding connectors 610 and 620 to the signal transmission line 10B according to the third preferred embodiment of the present invention, and differs in the arrangement of the hollow portion from the signal transmission line 10B. It is to be noted that the connectors 610 and 620 are also able to be omitted. Features of the signal transmission line according to the eleventh preferred embodiment shown in FIG. 16 that are the same as or similar to the features of the signal transmission line according to the third preferred embodiment shown in FIG. 5 are denoted by the same reference characters.

In a signal transmission portion 21K of the signal transmission line 10K, hollow portions 813, 814, 823, and 824 are provided in a laminate 20K. The hollow portions 813 and 823 overlap with each other in a plan view. The signal conductor 31 is disposed between the hollow portions 813 and 823. The hollow portions 814 and 824 overlap with each other in a plan view. The signal conductor 31 is disposed between the hollow portions 814 and 824. The hollow portions 813 and 823 and the hollow portions 814 and 824 are disposed with a space between each other in a direction in which the laminate 20K extends.

As a result, the signal transmission portion 21K of the laminate 20K is provided with a portion that includes the hollow portions 813 and 823, a portion that includes the hollow portions 814 and 824, and a portion that includes no hollow portion. The portion that includes no hollow portion, in the direction in which the signal transmission portion 21K of the laminate 20K extends, is provided between the portion that includes the hollow portions 813 and 823 and the portion that includes the hollow portions 814 and 824.

According to such a configuration, as illustrated in FIG. 16, the laminate 20K is mounted on a circuit board BP that has a difference in level by using the portion that includes no hollow portion in the signal transmission portion 21K as a bent portion, attaching the connector 610 to a connector B610, and attaching the connector 620 to a connector B620. In this manner, by using the portion that includes no hollow portion as the bent portion of the signal transmission portion 20K, the hollow portion is able to be prevented from deforming due to the bending. As a result, transmission loss is able to be further reliably reduced.

The configuration of the present preferred embodiment is also applicable to the structure of the microstrip line and the structure of the stripline according to the first and second preferred embodiments of the present invention.

Figure 17:
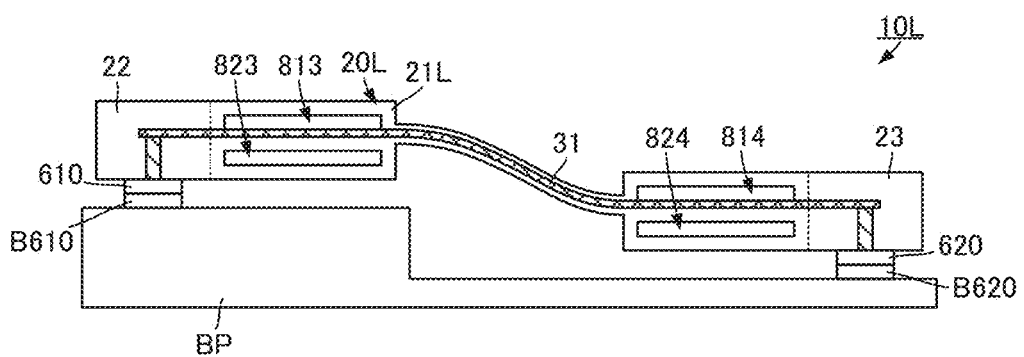
FIG. 17 is a side cross-sectional view of a structure of a signal transmission line according to a twelfth preferred embodiment of the present invention.

Subsequently, a signal transmission line according to a twelfth preferred embodiment of the present invention will be described with reference to the drawings. FIG. 17 is a side cross-sectional view of a structure of a signal transmission line according to the twelfth preferred embodiment of the present invention.

A signal transmission line 10L according to the twelfth preferred embodiment of the present invention differs from the signal transmission line 10K according to the eleventh preferred embodiment of the present invention in that the thickness of a laminate 20L at the bending portion is thin. Features of the signal transmission line according to the twelfth preferred embodiment shown in FIG. 17 that are the same as or similar to the features of the signal transmission line according to the eleventh preferred embodiment shown in FIG. 16 are denoted by the same reference characters.

A signal transmission portion 21L of the laminate 20L includes a portion that includes the hollow portions 813 and 823, a portion that includes the hollow portions 814 and 824, and a portion that includes no hollow portion. The thickness of the portion that includes no hollow portion is thinner than the thickness of the portion that includes a hollow portion. The thin portion is a bent portion.

With such a configuration, similarly to the eleventh preferred embodiment, the hollow portion is able to be prevented from deforming and bending is further easier.

The configuration of the present preferred embodiment, except the bent portion, is also applicable to the structure of the microstrip line and the structure of the stripline according to the first and second preferred embodiments of the present invention. Although it is also possible to apply the structure of the microstrip line and the structure of the stripline to the bending portion, in such a case, the thickness, and the line width of the signal conductor 31 may be set in consideration of characteristic impedance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A signal transmission line comprising:
a laminate including a plurality of resin layers each of which has flexibility, the plurality of resin layers being laminated, and the laminate having flexibility;
a signal conductor extending in a signal transmission direction of the laminate and being provided in an intermediate position in a laminating direction in which the plurality of resin layers are laminated;
a hollow portion provided in the laminate and defined by an opening provided at a portion of the plurality of resin layers; and
a reinforcing conductor provided in the laminate; wherein the hollow portion is disposed at a position that overlaps with the signal conductor when viewed in the laminating direction;

the hollow portion is exposed to outside of the laminate through a vent hole provided in the laminate; and the reinforcing conductor is disposed at a position different from the position of the hollow portion when viewed in the laminating direction.

2. The signal transmission line according to claim 1 further comprising:

a ground conductor; wherein the ground conductor faces the signal conductor with the hollow portion interposed therebetween in the laminating direction.

3. The signal transmission line according to claim 1, wherein the reinforcing conductor includes a plurality of reinforcing conductors; and the plurality of reinforcing conductors are disposed in the laminating direction.

4. The signal transmission line according to claim 3, wherein the plurality of reinforcing conductors are connected to each other through an interlayer connection conductor in the laminating direction.

5. The signal transmission line according to claim 1, wherein the reinforcing conductor includes a plurality of reinforcing conductors; and the plurality of reinforcing conductors are disposed at intervals in the signal transmission direction.

6. The signal transmission line according to claim 1, wherein the signal conductor is provided on a resin layer of the plurality of resin layers that includes a first portion that does not overlap with the hollow portion and a second portion that overlaps with the hollow portion; and a thickness of the first portion is smaller than a thickness of the second portion.

7. The signal transmission line according to claim 1, wherein the hollow portion is filled with an inert gas.

8. The signal transmission line according to claim 1, wherein the signal conductor includes a plurality of signal conductors;

the plurality of signal conductors are disposed in a width direction perpendicular or substantially perpendicular to the laminating direction in the flexible laminate;

the flexible laminate includes an intermediate holding portion that does not include the hollow portion between the plurality of signal conductors, in the width direction; and the intermediate holding portion includes the reinforcing conductor.

9. The signal transmission line according to claim 8, wherein the reinforcing conductor provided in the intermediate holding portion is grounded.

* * * * *